United States Patent
Bergmann et al.

(10) Patent No.: US 7,751,269 B2
(45) Date of Patent: Jul. 6, 2010

(54) COUPLING DEVICE FOR TRANSMITTING DATA

(75) Inventors: Daniel Bergmann, Munich (DE); Christian Erben, Munich (DE); Eric Labarre, Cagnes sur Mer (FR)

(73) Assignee: Infineon Technologies AG, Neubiberg (DE)

( * ) Notice: Subject to any disclaimer, the term of this patent is extended or adjusted under 35 U.S.C. 154(b) by 455 days.

(21) Appl. No.: 11/864,413

(22) Filed: Sep. 28, 2007

(65) Prior Publication Data
US 2008/0080283 A1    Apr. 3, 2008

Related U.S. Application Data

(60) Provisional application No. 60/847,869, filed on Sep. 28, 2006.

(30) Foreign Application Priority Data
Sep. 28, 2006    (DE)    ............ 10 2006 045 903

(51) Int. Cl.
*G11C 7/00*    (2006.01)

(52) U.S. Cl. ............ 365/219; 365/83; 365/189.02; 365/189.03; 365/189.16; 365/189.17; 365/189.05; 365/189.08; 365/189.12; 365/220; 365/221; 365/230.08; 365/239

(58) Field of Classification Search ............ 365/83, 365/189.02, 189.03, 189.16, 189.17, 189.08, 365/189.12, 219, 220, 221, 230.08, 239, 365/189.05
See application file for complete search history.

(56) References Cited

U.S. PATENT DOCUMENTS

| 5,404,484 | A |  | 4/1995 | Schlansker et al. |
| 7,372,759 | B2 | * | 5/2008 | Lee ............ 365/226 |
| 7,602,656 | B2 | * | 10/2009 | Lee ............ 365/189.17 |
| 7,616,518 | B2 | * | 11/2009 | Im et al. ............ 365/230.05 |
| 2002/0049888 | A1 | * | 4/2002 | Hertwig et al. ............ 711/117 |
| 2006/0250882 | A1 | * | 11/2006 | Choi et al. ............ 365/233 |

FOREIGN PATENT DOCUMENTS

DE    43 30 751 C2    3/1994

* cited by examiner

*Primary Examiner*—Hoai V Ho
*Assistant Examiner*—Fernando N Hidalgo
(74) *Attorney, Agent, or Firm*—Dickstein, Shapiro, LLP.

(57) ABSTRACT

Embodiments of the invention relate generally to a coupling device, to a processor arrangement, to a data processing arrangement, and to methods for transmitting data. In an embodiment of the invention, a coupling device for coupling a memory, which has a serial data output, with a processor, which has a parallel data input, is provided. The coupling device may include a serial data interface configured to receive data, a parallel data interface configured to transmit data, and a cache memory coupled to the serial data interface and to the parallel data interface, wherein the cache memory is configured to receive and store data, which have been received in a serial data format via the serial data interface, and to transmit data stored in the cache memory to the parallel data interface.

22 Claims, 2 Drawing Sheets

COUPLING DEVICE FOR TRANSMITTING DATA

CROSS-REFERENCE TO RELATED APPLICATION

This application claims priority to German Patent Application Serial No. 10 2006 045 903.2, and to U.S. Provisional Patent Application Ser. No. 60/847,869, both of which were filed Sep. 28, 2006, and are incorporated herein by reference in their entireties.

TECHNICAL FIELD

Embodiments of the invention relate generally to a coupling device, to a processor arrangement, to a data processing arrangement, and to methods for transmitting data.

BACKGROUND

With a plurality of arrangements which have a processor, it is necessary to transmit data between a memory, which is arranged outside the processor, and the processor. In this case, the processor may have a parallel data interface and the memory may have a serial data interface. It is desirable that such arrangements are powerful and inexpensive.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
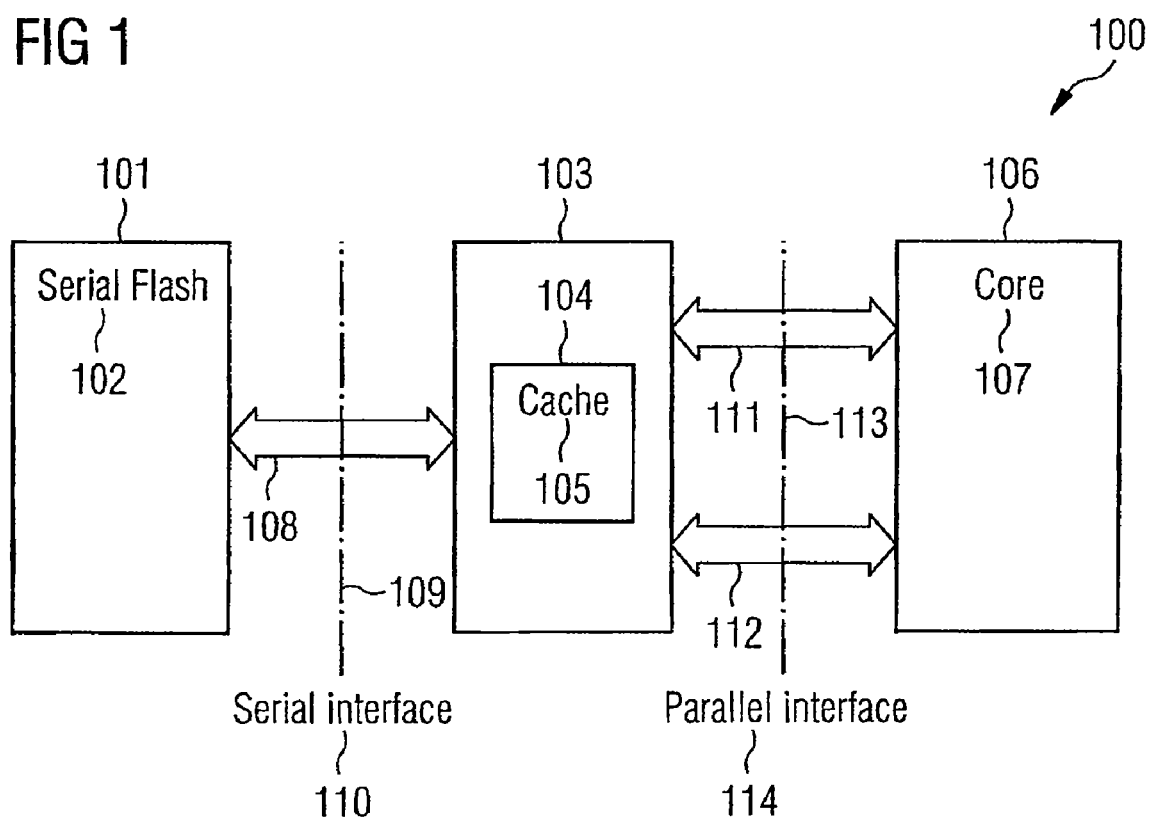
FIG. 1 shows a data processing arrangement having a coupling device in accordance with an embodiment of the invention.

Referring to FIG. 1, a data processing arrangement having a coupling device in accordance with an embodiment of the invention will be described in more detail below. The blocks shown in the block diagram respectively symbolize functional blocks or circuit blocks, the shown double-headed arrows respectively symbolize connections or couplings between the different blocks.

FIG. 1 shows a data processing arrangement 100 having a serial Flash memory 101, in FIG. 1 designated with the expression "Serial Flash" 102, a coupling device 103 and a processor 106, in FIG. 1 designated with the expression "Core" 107 (processor, processor kernel). A cache memory 104, in FIG. 1 designated with the expression "Cache" 105 is shown within the coupling device. A serial data connection 108 shown as a double-headed arrow exists between the serial Flash memory 101 and the coupling device 103. A dashed separation line 109 between the memory 101 and the coupling device 103 (in FIG. 1 designated with the expression "Serial interface" 110) symbolizes that the serial Flash memory 101 and the coupling device 103 are coupled with each other via serial data interfaces. The coupling device 103 and the processor 106 are coupled with each other by means of a parallel address bus 111 shown as a double-headed arrow.

Furthermore, the coupling device 103 and the processor 106 are coupled with each other by means of a parallel data bus 112 shown as a further double-headed arrow. The dashed separation line 113 between the coupling device 103 and the processor 106 (in FIG. 1 designated with the expression "Parallel interface" 114) symbolizes that the coupling device 103 and the processor 106 are coupled with each other by means of parallel data interfaces.

The coupling device 103 may be understood as a converting device or bridge, which converts the serial data format used at the serial data interface of the memory 101 into the parallel data format used at the parallel data interface of the processor 106, and vice versa. Due to the provided cache memory 104, this serial-parallel-bridge additionally has cache capability. Thus, the possible data throughput through the coupling device 103 and thus the possible data processing speed in the processor 106 is increased, e.g. in case that a software application executed by the processor 106 needs data from the serial Flash memory 101 or in case that the processor 106 needs an instruction code for execution of an application, which has to be transmitted from the serial Flash memory 101 to the processor 106, before the instruction code can be executed by the processor 106. A so-called "Code execution in place" is made possible with this described arrangement, i.e. clearly expressed a direct, immediate execution of instruction code loaded from the memory 101 into the processor 106. In an embodiment of the invention, direct and immediate execution of instruction code may mean that the code does no longer need to be copied e.g. into an additional memory with fast parallel access capability, before it can be executed from the processor.

The coupling device 103 carries out the protocol for the controlling and the communication of the serial Flash memory 101 and the cache memory 104. The workflow, e.g. for loading of instruction code to be executed into the processor 106, is as follows: The processor 106 requests a data word of the instruction code with a specific address for execution via the parallel interface. The requested specific address is transmitted to the coupling device 103 via the parallel address bus 111. In case that the requested address is stored in the cache memory 104 (a so-called "cache hit"), the associated data content, which in this case is also stored in the cache memory 104, is transmitted to the processor 106 via the parallel data bus 112. In case that the requested address is not stored in the cache memory 104 (a so-called "cache miss"), an access to the content of the serial Flash memory 101 via the serial data connection 108 is provided. A plurality of data words, which include the requested data word, in general: a larger amount of data, which include the requested instruction code or the requested data as a portion, are transmitted via the serial data connection 108, and a memory row of the cache memory 104 is completely newly filled, for example. In this case, the requested data word is first transmitted in the serial data format from the memory 101 to the coupling device 103, and then it is transmitted in the parallel data format from the coupling device 103 to the processor 106.

In an embodiment of the invention, the coupling device 103 and the processor 106 may be accommodated or integrated in one single integrated circuit. In an embodiment of the invention, the coupling device 103 and the processor 106 may be connected with each other by means of parallel data bus structures. This represents a powerful, efficient and inexpensive arrangement. The serial Flash memory 101 can be connected to the integrated circuit as an external memory, wherein the serial Flash memory 101 and the integrated circuit may e.g. be accommodated on a common printed circuit board. The use of a serial Flash memory in such an arrangement instead of a parallel Flash memory makes it possible to reduce the complexity and the costs of the arrangement. By means of a serial external memory instead of a parallel external memory, inter alia, the number of required connection terminals of the integrated circuit and the complexity of the connection lines or connection leads on the printed circuit board is reduced. In case that the processor 106 executes a software application, the instruction code of which is stored in the external memory, and the processor 106 requests a particular required data word of the instruction code, this may often be taken from the cache memory 104 and can be transferred to the processor 106 in a very fast manner. A direct and immediate execution of the instruction code is made possible. It is not necessary to read the instruction code of an application from the serial external memory before its execution and to buffer it in an additional memory for the fast access during the execution of the application. The processor 106 does not need a serial interface for this purpose, since no direct access of the processor 106 to the serial Flash memory 101 is necessary. The memory interface of the processor 106 does not need to be supplemented with the support of a serial interface. The usually existing parallel interface is sufficient. By means of the coupling device 103, the performance of an arrangement having a processor and an external serial memory is increased, for example with regard to the real-time behavior of software applications.

The data processing arrangement is suitable for the use in a communication terminal device, e.g. a mobile radio telephone.

Figure 2:
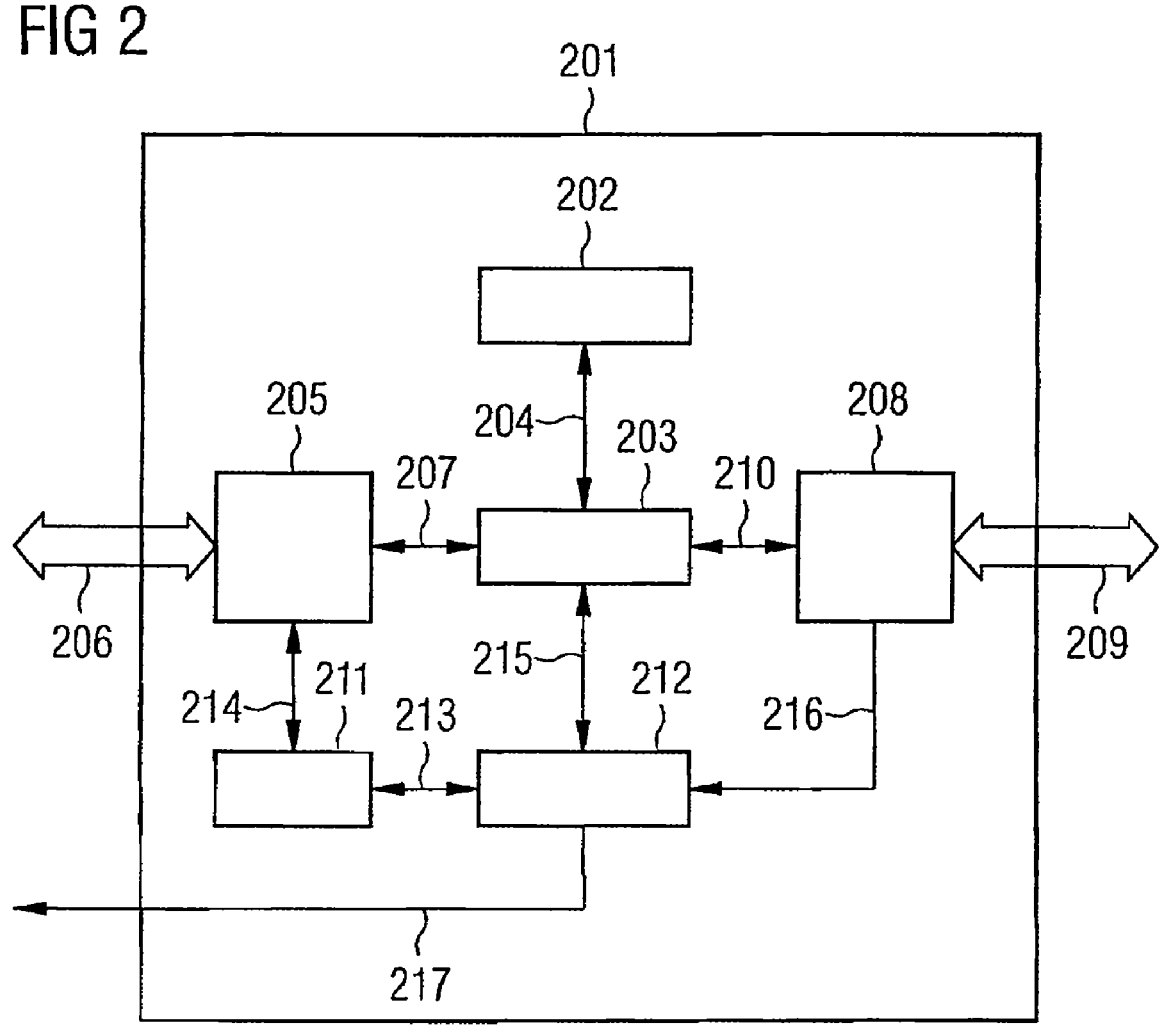
FIG. 2 shows a coupling device in accordance with an embodiment of the invention.

Referring to FIG. 2, a coupling device in accordance with an embodiment of the invention will be described in more detail below. The blocks shown in the block diagram respectively symbolize functional blocks or circuit blocks, the shown double-headed arrows respectively symbolize connections or couplings between the different blocks.

FIG. 2 shows a coupling device 201 similar to the coupling device 103 of FIG. 1, however, shown with more details. By way of example, the coupling device 201 has a cache data region 202 and a cache control logic 203, which are coupled with each other, which is symbolized by means of the double-headed arrow 204. The cache data region 202 and the cache control logic 203 may be understood as a cache memory of a similar type as the cache memory 104 shown in FIG. 1.

The coupling device 201 further includes a first interface controller 205, which is coupled with a parallel data connection 206 for the connection of external devices, which use a parallel data format for data transmission. The first interface controller 205 is coupled with the cache control logic 203 (symbolized by means of double-headed arrow 207). The first interface controller 205 and the parallel data connection 206 may be understood as a parallel data interface, wherein the controller clearly represents the "intelligence" built in the interface. The first interface controller 205 can e.g. control a parallel data bus, it can multiplex data, it can encode or decode data, and it can switch back and forth operating states at the data bus.

The coupling device 201 further includes a second interface controller 208, which is coupled with a serial data connection 209 for the connection of external devices, which use a serial data format for data transmission. The second interface controller 208 is also coupled with the cache control logic 203 (symbolized by means of double-headed arrow 210). The second interface controller 208 and the serial data connection 209 may be understood as a serial data interface, wherein the controller clearly represents the "intelligence" built in the interface. The second interface controller 208 is e.g. a controller for the interface type "SPI".

The cache data region 202 and the cache control logic 203 can be organized in different ways, which may e.g. be characterized in the size of a memory cell, the number of paths and the total size. In an embodiment of the invention, it is assumed that the cache data region 202 has a plurality of memory cells, each of them having the size of four data words. When a request o a data word of a particular address is received via the parallel data connection 206, the cache control logic 203 determines as to whether the data word assigned to this address is stored in the cache data region 202. In case that the data word is stored in the cache data region 202, the data word is output via the parallel data connection 206. In case that the data word is not stored in the cache data region 202, a complete download of the corresponding memory row of the cache data region 202 is requested. The bus cycle of the parallel data connection 206 is delayed in this case so long until the download of the memory row with four data words is completed. Then, the requested data word, which is included in the four downloaded data words, is output via the parallel data connection 206.

The embodiment shown in FIG. 2 further includes a buffer data region 211 and a buffer control logic 212, which are coupled with each other, which is symbolized by means of the double-headed arrow 213. The buffer data region 211 and the buffer control logic 212 may be understood as buffer memory, which is organized independently from the cache memory, but is coupled with the cache memory and the other components, so that a coordinated control of the various components is made possible. The buffer data region 211 is coupled with the first interface controller 205 (symbolized by means of double-headed arrow 214), the buffer control logic 212 is coupled with the cache control logic 203 (symbolized by means of double-headed arrow 215) and with the second interface controller 208 (symbolized by means of double-headed arrow 216). Furthermore, one or more control lines 217 are provided to couple the buffer control logic 212 with an external device, which is coupled with the parallel data connection 206.

Larger data blocks or—more general—such data blocks which are not stored in the cache data region 202 with some probability, can be read using the serial data connection 209 bypassing the cache memory and can be output via the parallel data connection 206 by means of the buffer memory. For this purpose, the start address and the size of the corresponding data block is handed over to the buffer control logic 212. The buffer control logic 212 triggers the reading in of the data of the data block via the second interface controller 208 and stores the serially read in data in the buffer data region 211, until the complete requested data block is read in.

The reading in of a data block via the serial data connection 209 in the buffer data region 211 can occur in parallel with the requesting and outputting via the parallel data connection 206 of data stored in the cache data region 202. In case that data are requested which are not stored in the cache memory, and a complete download of a memory row of the cache data region 202 has to occur, a possibly just running reading in of data via the serial data connection 209 into the buffer data region 211 may temporarily be interrupted, and the downloading of the memory row into the cache data region 202 via the serial data connection 209 has a higher priority.

In an embodiment of the invention, after the reading in of the complete requested data block into the buffer data region 211 of the connected external device, the buffer control logic 212 indicates to e.g. the processor, which has requested the data block via the control lines 217, that the data block is completely present in the buffer memory. Then, the data block is completely transferred to the external device via the parallel data connection 206. This may e.g. occur via a DMA (Direct Memory Access) data transfer, or in case that the external device is a processor of the type "C166", by means of a so-called PEC-transfer.

In the described cooperation of the components, the bypassing the cache memory by means of the buffer memory does not cause any delay, if data, which are expected in the cache memory, and which are possibly time critical, are requested for output via the parallel data connection 206. The relatively slow reading in of data via the serial data connection 209 into the buffer data region 211 may occur in parallel with the requesting and outputting of other data via the parallel data connection 206, and the downloading of data via the serial data connection 209 into the cache memory has a higher priority than the reading in into the buffer memory. As soon as a complete data block is present in the buffer data region 211, it can be output relatively fast via the parallel data connection 206. Thus, e.g. a complete SMS (Short Message Service) may be loaded from a serial Flash memory of a mobile radio telephone into a processor of the mobile radio telephone, without disturbing the other data requests of the processor.

In accordance with an embodiment of the invention, a coupling device for coupling a memory, the memory having a serial data output, with a processor, the processor having a parallel data input, is provided. The coupling device may include a serial data interface to receive data, a parallel data interface to transmit data, and a cache memory coupled to the serial data interface and to the parallel data interface, wherein the cache memory is configured to receive and store data, which have been received in a serial data format via the serial data interface, and to transmit data stored in the cache memory to the parallel data interface.

In accordance with another embodiment of the invention, a processor arrangement is provided. The processor arrangement may include a coupling device for coupling a memory, the memory having a serial data output, with a processor, the processor having a parallel data input, wherein the coupling device may include a serial data interface to receive data, a parallel data interface to transmit data, and a cache memory coupled to the serial data interface and to the parallel data interface, wherein the cache memory is configured to receive and store data, which have been received in a serial data format via the serial data interface, and to transmit data stored in the cache memory to the parallel data interface. The processor arrangement may further include a processor having a parallel data interface, which is coupled with the parallel data interface of the coupling device.

In accordance with yet another embodiment of the invention, a data processing arrangement is provided. The data processing arrangement may include a coupling device for coupling a memory, the memory having a serial data output, with a processor, the processor having a parallel data input, wherein the coupling device may include a serial data interface to receive data, a parallel data interface to transmit data, and a cache memory coupled to the serial data interface and to the parallel data interface, wherein the cache memory is configured to receive and store data, which have been received in a serial data format via the serial data interface, and to transmit data stored in the cache memory to the parallel data interface. The data processing arrangement may further include a processor having a parallel data interface, which is coupled with the parallel data interface of the coupling device, and a memory having a serial data interface, which is coupled with the serial data interface of the coupling device.

In accordance with yet another embodiment of the invention, a method for transmitting data from a memory, the memory having a serial data output, to a processor, the processor having a parallel data input, is provided. The method may include transmitting data from the memory to a cache memory in serial data format, receiving and storing the data, which have been received in a serial data format, in the cache memory, reading the stored data from the cache memory, and transmitting the read data in a parallel data format to the processor.

In accordance with yet another embodiment of the invention, a method for transmitting data from a processor, the processor having a parallel data input, to a memory, the memory having a serial data output, is provided. The method may include transmitting data from the processor to a cache memory in parallel data format, receiving and storing the data, which have been received in a parallel data format, in the cache memory, outputting the stored data from the cache memory, and transmitting the output data in a serial data format to the memory.

The embodiments described hold true, where appropriate, for the coupling device, the processor arrangement, the data processing arrangement, as well as for the methods for transmitting data.

In various embodiments of the invention, the parallel data interface is further configured to receive data.

In an embodiment of the invention, the parallel data interface is configured to receive instruction data specifying that data or which data should be transmitted by the parallel data interface.

In an embodiment of the invention, the parallel data interface a parallel data bus and a parallel address bus.

In an embodiment of the invention, the serial data interface is further configured to transmit data.

In an embodiment of the invention, the serial data interface is configured to transmit instruction data specifying that data or which data should be read from a memory and should be received by the parallel data interface.

In an embodiment of the invention, the cache memory is configured to check as to whether data, which are requested by means of instruction data received by means of the parallel data interface, are stored in the cache memory, and, in case that the requested data are stored in the cache memory, to directly output them to the parallel data interface, and, in case that the requested data are not stored in the cache memory, to cause the serial data interface to transmit instruction data, which specify that the requested data should be read from a memory and should be received by the serial data interface.

In an embodiment of the invention, the cache memory is configured to, in case that the requested data are not stored in the cache memory, cause the serial data interface to transmit instruction data, which specify that a data amount that is larger than the requested data and which comprises the requested data, should be read from a memory and should be received by the serial data interface.

In an embodiment of the invention, the data amount is at least so large that it can fill a memory row of the cache memory.

In an embodiment of the invention, the requested data includes instruction code which should be received by a processor, which has a parallel data interface, by means of the parallel data interface, and which should directly be executed by the processor.

In an embodiment of the invention, the coupling device may further include a buffer memory, which is coupled with the serial data interface and with the parallel data interface, wherein the buffer memory is configured to store data, which the serial data interface has received, and to output data which are stored in the buffer memory, to the parallel data interface.

In an embodiment of the invention, the cache memory is configured to receive data, which the parallel data interface has received, and to output received data to the serial data interface.

In an embodiment of the invention, the processor is a processor of a communication terminal device.

In an embodiment of the invention, the processor is a processor of a mobile radio telephone.

In an embodiment of the invention, the processor arrangement may be contained in an integrated circuit.

In an embodiment of the invention, the memory is a serial Flash memory.

In an embodiment of the invention, the data processing arrangement is implemented in the form circuits on a common substrate.

In an embodiment of the invention, the data are requested by the processor.

In an embodiment of the invention, a method for transmitting data may further include checking as to whether the data requested by the processor are stored in the cache memory, in case that the requested data are stored in the cache memory, reading the data from the cache memory and directly transmitting the read data to the processor, in case that the requested data are not stored in the cache memory, requesting the data from the memory.

In an embodiment of the invention, the requested data include instruction code which should directly be executed by the processor.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A coupling device for coupling a memory, which has a serial data output, with a processor, which has a parallel data input, the coupling device comprising:
   a serial data interface configured to receive data;
   a parallel data interface configured to transmit data;
   a cache memory coupled to the serial data interface and to the parallel data interface, wherein the cache memory is configured to receive and store data, which have been received in a serial data format via the serial data interface, and to transmit data stored in the cache memory to the parallel data interface; and
   a buffer memory, which is coupled with the serial data interface and with the parallel data interface, wherein the buffer memory is configured to store data, which the serial data interface has received, and to output data which are stored in the buffer memory, to the parallel data interface.

2. The coupling device of claim 1,
   wherein the parallel data interface is further configured to receive data.

3. The coupling device of claim 2,
   wherein the parallel data interface is further configured to receive instruction data specifying which data should be transmitted by the parallel data interface.

4. The coupling device of claim 3,
   wherein the parallel data interface comprises a parallel data bus and a parallel address bus.

5. The coupling device of claim 1,
   wherein the serial data interface is further configured to transmit data.

6. The coupling device of claim 5,
   wherein the serial data interface is further configured to transmit instruction data specifying which data should be read from a memory and should be received by the parallel data interface.

7. The coupling device of claim 2,
   wherein the cache memory is configured to receive data, which the parallel data interface has received, and to output the received data to the serial data interface.

8. A coupling device for coupling a memory, which has a serial data output, with a processor, which has a parallel data input, the coupling device comprising:
   a serial data interface configured to receive data;
   a parallel data interface configured to transmit data; and
   a cache memory coupled to the serial data interface and to the parallel data interface, wherein the cache memory is configured to receive and store data, which have been received in a serial data format via the serial data interface, and to transmit data stored in the cache memory to the parallel data interface,
   wherein the cache memory is further configured to check as to whether data, which are requested by means of instruction data received by means of the parallel data interface, are stored in the cache memory, and, in case that the requested data are stored in the cache memory, to directly output the stored data to the parallel data interface, and, in case that the requested data are not stored in the cache memory, to cause the serial data interface to transmit instruction data, which specify that the requested data should be read from a memory and should be received by the serial data interface.

9. The coupling device of claim 8,
   wherein the cache memory is further configured to, in case that the requested data are not stored in the cache memory, cause the serial data interface to transmit instruction data, which specify that a data amount that is larger than the requested data and which comprises the requested data, should be read from a memory and should be received by the serial data interface.

10. The coupling device of claim 9,
    wherein the data amount is at least so large that it can fill a memory row of the cache memory.

11. The coupling device of claim 8,
    wherein the requested data comprise instruction code which should be received by a processor, which has a parallel data interface, by means of the parallel data interface, and which should directly be executed by the processor.

12. A processor arrangement, comprising:
    a coupling device for coupling a memory, which has a serial data output, with a processor, which has a parallel data input, the coupling device, comprising:
    a serial data interface configured to receive data;
    a parallel data interface configured to transmit data;
    a cache memory coupled to the serial data interface and to the parallel data interface, wherein the cache memory is configured to receive and store data, which have been received in a serial data format via the serial data interface, to transmit data stored in the cache memory to the parallel data interface; and
    a buffer memory, which is coupled with the serial data interface and with the parallel data interface, wherein the buffer memory is configured to store data, which the serial data interface has received, and to output data which are stored in the buffer memory, to the parallel data interface, and a processor having a parallel data interface, which is coupled with the parallel data interface of the coupling device.

13. The processor arrangement of claim 12, wherein the processor is a processor of a communication terminal device.

14. The processor arrangement of claim 13, wherein the processor is a processor of a mobile radio telephone.

15. The processor arrangement of claim 12, being comprised in an integrated circuit.

16. A data processing arrangement, comprising:

a coupling device for coupling a memory, which has a serial data output, with a processor, which has a parallel data input, the coupling device, comprising:

a serial data interface configured to receive data;

a parallel data interface configured to transmit data; and a cache memory coupled to the serial data interface and to the parallel data interface, wherein the cache memory is configured to receive and store data, which have been received in a serial data format via the serial data interface, and to transmit data stored in the cache memory to the parallel data interface, wherein the cache memory is further configured to check as to whether data, which are requested by means of instruction data received by means of the parallel data interface, are stored in the cache memory, and, in case that the requested data are stored in the cache memory, to directly output the stored data to the parallel data interface, and, in case that the requested data are not stored in the cache memory, to cause the serial data interface to transmit instruction data, which specify that the requested data should be read from a memory and should be received by the serial data interface;

a processor having a parallel data interface, which is coupled with the parallel data interface of the coupling device; and a memory having a serial data interface, which is coupled with the serial data interface of the coupling device.

17. The data processing arrangement of claim 16, wherein the memory is a serial Flash memory.

18. The data processing arrangement of claim 16, which is implemented in form circuits on a common substrate.

19. A method for transmitting data from a memory, which has a serial data output, to a processor, which has a parallel data input, the method comprising:

transmitting data from the memory to a cache memory in serial data format;

receiving and storing the data, which have been received in a serial data format, in the cache memory;

reading the stored data from the cache memory;

transmitting the read data in a parallel data format to the processor; and storing data, which has been received in serial format, in a buffer memory, and outputting data, which are stored in the buffer memory, in a parallel data format.

20. The method of claim 19, wherein the data are requested by the processor.

21. The method of claim 20, further comprising:

checking as to whether the data requested by the processor are stored in the cache memory;

in case that the requested data are stored in the cache memory, reading the data from the cache memory and directly transmitting the read data to the processor; and in case that the requested data are not stored in the cache memory, requesting the data from the memory.

22. The method of claim 19, wherein the requested data comprise instruction code which should directly be executed by the processor.

* * * * *